United States Patent
Mosier

(10) Patent No.: US 7,697,646 B2
(45) Date of Patent: Apr. 13, 2010

(54) DISCRETE STATE-SPACE FILTER AND METHOD FOR PROCESSING ASYNCHRONOUSLY SAMPLED DATA

(75) Inventor: Daniel J. Mosier, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 889 days.

(21) Appl. No.: 11/470,438

(22) Filed: Sep. 6, 2006

(65) Prior Publication Data
US 2008/0056416 A1     Mar. 6, 2008

(51) Int. Cl.
H04B 1/10     (2006.01)
H03K 9/00     (2006.01)
(52) U.S. Cl. .................. 375/350; 375/346; 375/316
(58) Field of Classification Search .............. 375/350, 375/346, 316
See application file for complete search history.

(56) References Cited

U.S. PATENT DOCUMENTS 5,432,816 A     7/1995     Gozzo
7,110,448 B2     9/2006     Bergmans et al.
2005/0100105 A1     5/2005     Jensen
2007/0027578 A1*     2/2007     Colens ................. 700/245
2007/0218931 A1*     9/2007     Beadle et al. .............. 455/502
2007/0258526 A1*     11/2007     Urvas ...................... 375/260

OTHER PUBLICATIONS

F. Aeschlimann et al, Asynchronous FIR Filters: Towards a New Digital Processing Chain, IEEE, 2004.

* cited by examiner

Primary Examiner—David C Payne
Assistant Examiner—Brian J Stevens
(74) Attorney, Agent, or Firm—Eric A. Gifford

(57) ABSTRACT

A discrete state-space filter directly applies a linear transfer function that describes the frequency-domain representation of an IIR filter or control plant to asynchronously sampled data. The discrete state-space technique maps a continuous time transfer function into the discrete state-space filter and stores the states of the filter in a sample-time independent fashion in a discrete state-space vector. The filter states are propagated with the asynchronous time measurements provided with the input data to generate the filtered output.

25 Claims, 13 Drawing Sheets

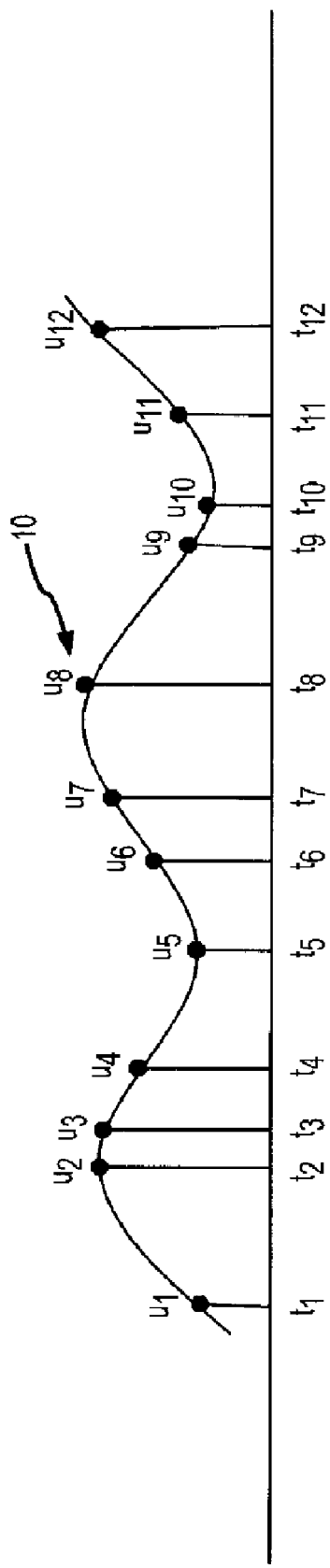
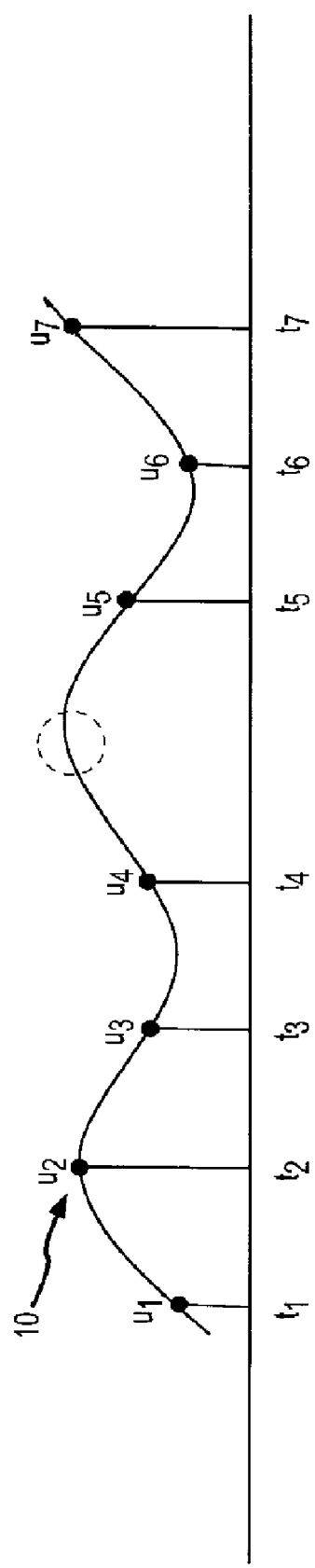
FIG.1a
FIG.1b

DISCRETE STATE-SPACE FILTER AND METHOD FOR PROCESSING ASYNCHRONOUSLY SAMPLED DATA

BACKGROUND OF THE INVENTION

1. Field of the Invention

This invention relates to processing asynchronously sampled data and, more particularly, to the use of a discrete state-space representation to process asynchronously sampled data.

2. Description of the Related Art

A fundamental assumption in classic digital signal processing algorithms used for filtering and control compensation is that the digital samples represent a uniform ("synchronous") sampling of the underlying analog signal. Ensuring uniform time sampling imposes a burdensome constraint upon the design of the system architecture and processing algorithms.

Asynchronous sampling can be caused at a number of different points in a system for a variety of reasons. In sensing applications the sensor may lose acquisition and the signal may "drop out" for a period of time. Communication channels likewise may suffer data "dropouts" due to temporary loss of signal. The digital sampling performed by the A/D converter can produce an asynchronous sequence for a variety of reasons. First, every A/D that is clocked at a uniform time interval has a certain amount of random phase error, or "jitter". The amount of jitter can be reduced but at increased cost and power consumption. Second, the system controlling the A/D may be asynchronous. For example, a low-cost commercial computer running a non-realtime operating system may interfere with the application software by preempting access to the hardware hosting the A/D. This can be overcome with a dedicated system with native synchronous capability but at increased cost. Lastly, it may be desirable to intentionally sample the analog signal asynchronously to adapt the sampling to the properties of the analog signal, e.g. local frequency content or event based triggering. Compression of the sequence may also cause samples to "drop out" and alternatively, algorithms capable of asynchronous signal processing may provide utility for operating on compressed data without the added steps of expansion and recompression.

Techniques for handling asynchronous sampling typically fall into one of two categories. The first approach is to assume that the samples are synchronous and spend the resources necessary from signal capture, control to the A/D converters to minimize and error and/or to design the overall system to tolerate or compensate for any asynchronism. This can be difficult, expensive and result in lower performance. The second approach is to convert the asynchronous data sequence into a synchronous data sequence. A causal technique extrapolates the amplitude of the next uniform sample from the existing non-uniform values. A 2-point extrapolation is computationally very simple but tends to amplify noise. Fixed rate estimation and extrapolation uses a dynamic model such as a Kalman Filter to predict the amplitude values. This approach has somewhat better performance but is more complication. A non-causal technique is to require the A/D to oversample the analog signal by at least 4× and more typically 8× or 16× and than interpolate to a uniform sampling rate. This provides better performance but at a much higher computational burden due to the oversampling.

Direct processing of asynchronous data could provide benefits of cost, efficiency and performance at the logic circuit level by easing the tolerance on the clock and eliminating the requirement for a global clock to synchronize all parts of a circuit, at a system level by allowing for distributed asynchronous processing and at an algorithmic level by allowing for the sampling to be adapted to the signal properties.

F. Aeschlimann et al. "Asynchronous FIR Filters: Towards a New Digital Processing Chain", Proc. of the $10^{th}$ Int. Symp. On Asynchronous Circuits and Systems (ASYNC'04) provides a formulation of the convolution operator for a Finite-Impulse-Response (FIR) filter for asynchronous sampled data. Aeschlimann provides a hardware-architecture for the convolution operator and demonstrates that the computational complexity of the asynchronous FIR filter can be far lower than that of the synchronous FIR filter provided that the signal statistics are well exploited.

A typical method to synthesize a synchronous Infinite-Impulse-Response (IIR) filter is to map the filter's continuous-time linear transfer function in the s-domain into discrete time using the bilinear transformation:

$$s = \frac{2}{\Delta t} \cdot \left( \frac{1 - z^{-1}}{1 + z^{-1}} \right)$$

Since the filter memory is contained in the delay taps, or $z^{-1}$ terms, which are dependent on the uniform sampling period $\Delta t$, the IIR filter is ill-suited for operation with a varying $\Delta t$. Other mapping techniques such as zero and first order hold suffer likewise. The typical approach is to specify a tolerable "jitter" and design the system to accommodate the worst case jitter. This can be costly and degrade performance.

In a control theory application, the "plant" of a servo compensator is modeled by mapping the coefficients of the continuous time linear transfer function into a continuous state-space representation. In most practical systems the plant is actually nonlinear. However, due to the complexity of solving nonlinear problems, the plant is typically either assumed to be linear or the problem formulation is "linearized" to make it approximately linearly. The continuous state-space representation is mapped into a discrete state-space representation for the uniform sampling period $\Delta t$. These discrete state transition matrix, input and output gain matrices and direct gain are computed offline and stored. For each successive input sample, a discrete state-space vector is updated and the amplitude of the output sample is calculated. These control applications typically place very stringent requirements on the uniformity of the sampling period. A certain tolerance may be accommodated by redesigning the underlying transfer function for the plant. However, ensuring that the performance of the servo compensator is bounded for some worst case deviation in the sampling period will degrade the overall performance.

An efficient technique or techniques for performing IIR filtering and control modeling on asynchronously sampled data and, more particularly, for adapting existing linear IIR filter and control plant designs for asynchronously sampled data is needed to reduce cost, improve performance and increase flexibility of the signal processing systems.

SUMMARY OF THE INVENTION

The present invention provides a method for direct application of a linear transfer function that describes the s-domain representation of an IIR filter or control plant to asynchronously sampled data. The method is particularly useful for adapting existing linear IIR filter and control plan designs for uniformly sampled data to asynchronously sampled data.

This is accomplished with a discrete state-space representation that is updated for each sample based on the time measurement for that sample. The described state-space technique maps a continuous time transfer function into a discrete time filter and stores the states of the filter in a sample-time independent fashion in a discrete state-space vector. The filter states are propagated with the asynchronous time measurements provided with the input data to generate the filtered output.

In an embodiment, asynchronously sampled data is processed by mapping the coefficients of a linear homogeneous frequency-domain transfer function that represents the IIR filter or control plant into a continuous state-space representation given by matrices A, B, C and D. A discrete state vector $X_k$ is defined that stores filter states independent of sample-time. For each successive data sample $u_k$, a discrete state transition matrix $\Phi$ and a discrete input matrix $\Gamma$ are updated from the continuous matrices A and B and a time measurement $\Delta t_k$ of the sample. The discrete state transition matrix $\Phi$ defines the extent the previous discrete state vector $X_{k-1}$ will affect the current state vector $X_k$ and the discrete input matrix F defines the extent the previous state $X_{k-1}$ is expected to change due to input data sample $u_k$. The discrete state vector is updated by multiplying the previous state vector $X_{k-1}$ by transition matrix $\Phi$ and adding the product of input matrix $\Gamma$ multiplied by the amplitude of the sample $u_k$. The state vector $X_k$ and the sample amplitude $u_k$ are multiplied by matrices C and D, respectively, and summed to give output sample $y_k$. Matrices $\Phi$ and $\Gamma$ are updated for each sample.

In another embodiment, the discrete time filter includes a coefficient arithmetic unit and a filter core. The coefficient arithmetic unit is configured to receive the continuous-time state-space representation of the linear frequency-domain transfer function and the time measurement of each successive data sample and to update the discrete state transition matrix and the discrete input matrix from the continuous state-space representation and the time measurement of the data sample. The filter core stores filter states sample-time independently in the discrete state vector. The core is configured to receive the updated discrete state transition matrix and the discrete input matrix from the CAU, an output gain matrix and an amplitude of the data sample, to update the discrete state vector by propagating the filter states in the previous state vector with the time measurements within the discrete state transition matrix and summing with the sample amplitude weighted by the discrete input matrix, and to calculate an output data sample amplitude as a function of the updated discrete state vector weighted by the output gain matrix and the sample amplitude weighted by the input-to-output gain matrix.

In a real-time application, the discrete state-space matrices $\Phi$ and $\Gamma$ must be updated quickly. This can be accomplished by simply providing sufficient processing power to compute the matrix exponential, which may be expensive. Alternately, the computational demands can be reduced by formulating the linear system as a cascade or parallel implementation of a plurality of s-domain transfer functions that are equivalent to the transfer function and/or simplifying the matrix exponentiation required to directly calculation $\Phi$ by using either a $1^{st}$ or higher order Taylor series approximation or a Jordan Canonical Form. Another approach would be to precalculate and store $\Phi$ and $\Gamma$ for a number of values of $\Delta t$. Instead of recalculating the matrices for each sample, the algorithm would select the closest matrices and use them directly or perform an interpolation. In yet another approach, calculations of $\Phi$ and $\Gamma$ can be conserved by caching results and monitoring $\Delta t$. If the value changes by more than a specified tolerance, $\Phi$ and $\Gamma$ are recalculated. Otherwise the last updated matrices or default matrices (e.g. for an expected uniform sampling period) are used to update the state vector.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 1a and 1b are diagrams illustrating asynchronously sampled data;

DETAILED DESCRIPTION OF THE INVENTION

The present invention provides a method for direct application of a linear transfer function that describes the frequency or s-domain representation of an IIR filter or control plant to asynchronously sampled data. The described discrete state-space technique maps a continuous time transfer function into a discrete time filter and stores the states of the filter in a sample-time independent fashion in a discrete state-space vector. The filter states are propagated with the asynchronous time measurements provided with the input data to generate the filtered output.

Digital signal processing algorithms used for filtering and control compensation include both linear and non-linear problems. Because non-linear problems are much more difficult to solve, they are oftentimes either 'assumed' to be linear or are 'linearized' prior to formulation. Thus, linear systems constitute a substantial majority of the practical problems in signal processing applications. Also, there exists many IIR filter and plant designs for known linear problems. The ability to adapt these for asynchronously sampled data is a great benefit.

A linear system is described by a differential equation relating a function x with its derivatives such that only linear combinations of derivatives appear in the equation and takes on the general form:

$$x = A_1 d(x) + A_2 d^2(x) \ldots A_n d^n(x)$$

where d is the derivative operator and A is a constant. Linearity indicates that no function of x or its derivatives will exceed order one nor include any functions of any other variable. Beyond the mathematical definition, linear systems have the desirable properties of having unique, existing solutions and of maintaining energy at any discrete frequency at that same frequency. Furthermore a linear system can be described by a cascade of simpler linear systems.

Examples of asynchronously sampled data 10 having amplitude $u_k$ at time $t_k$ are illustrated in FIGS. 1a and 1b. The sampling shown in FIG. 1a may be representative of a uniform sampling A/D that exhibits significant "jitter", an asynchronous control system such as a low-cost commercial computer running a non-realtime operating system or intentional asynchronous sampling adapted to the analog signal properties. The sampling shown in FIG. 1b is representative of a uniform sampling A/D that exhibits minimal jitter but is subject to "drop out" from, for example, the acquisition sensor or a communication channel. In both cases, the average sampling rate must still satisfy the Nyquist criteria. In accordance with the invention, each input sample must not only include its amplitude $u_k$ but also a time measurement $t_k$ or $\Delta t_k$.

Figure 2:
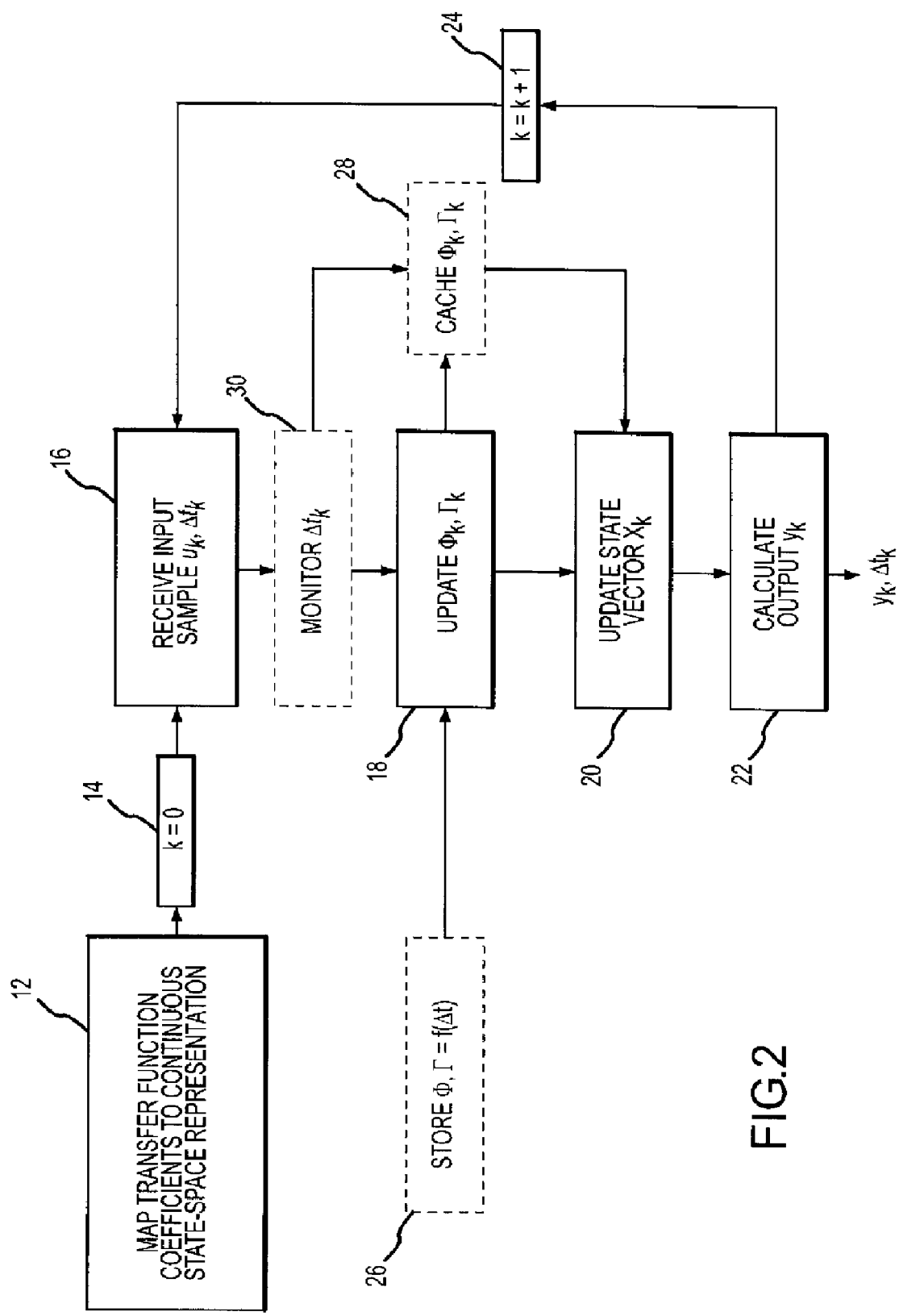
FIG. 2 is a flowchart of a method for processing asynchronously sampled data using a discrete state-space representation.
Figure 3:
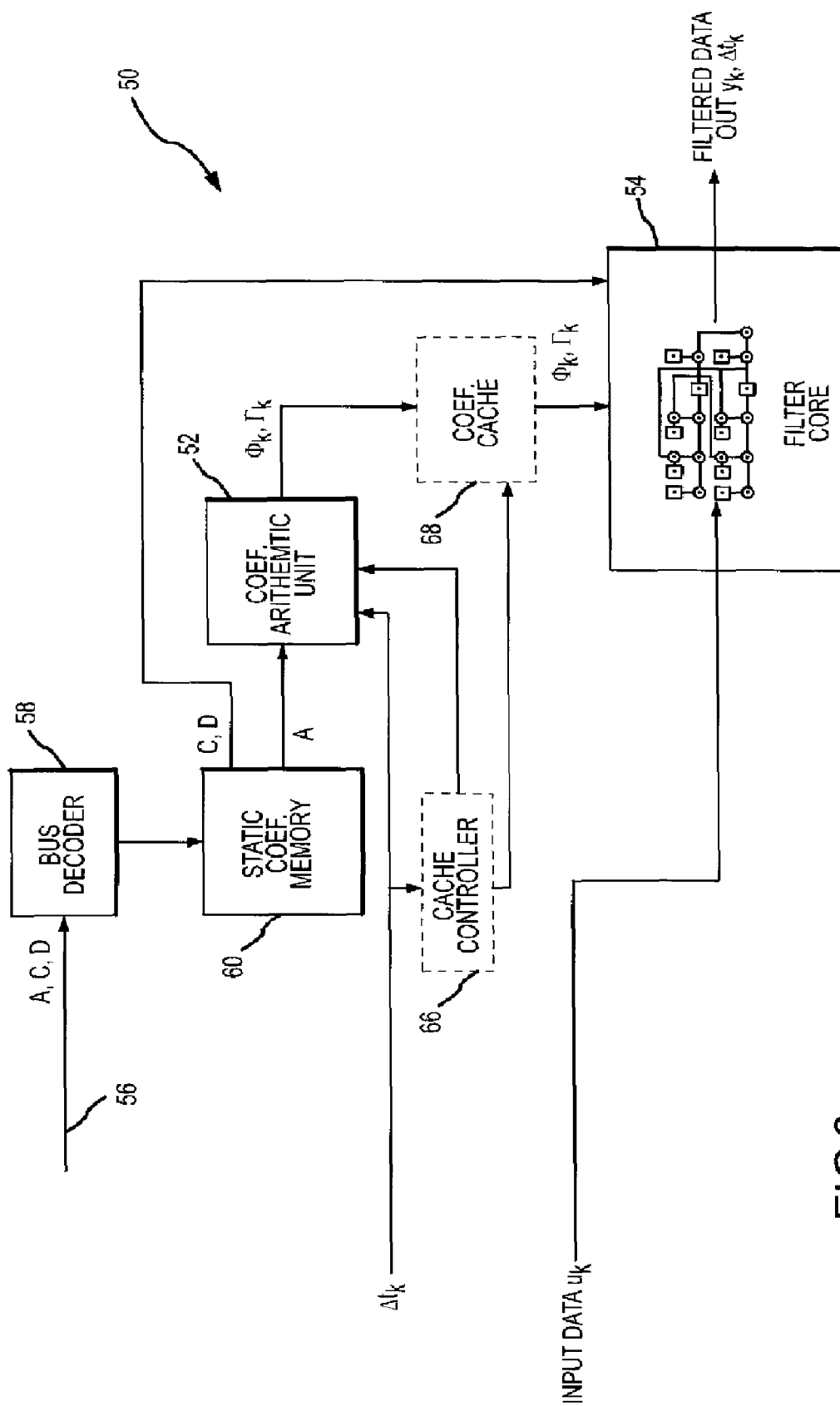
FIG. 3 is a block diagram of a hardware implementation of an asynchronous state-space filter.
Figure 4:
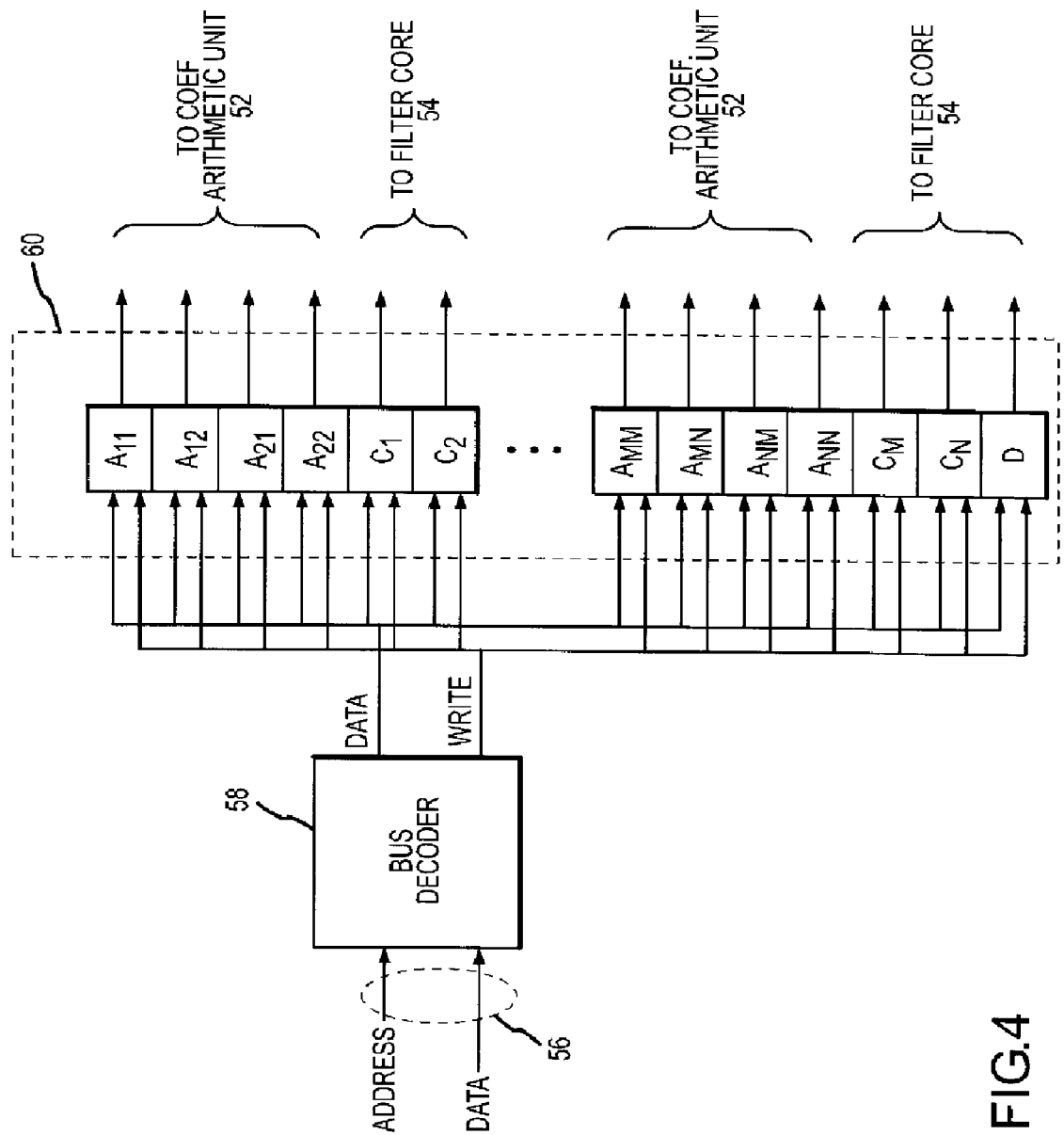
FIG. 4 is a block diagram of the filter's bus interface.

A method of discrete time filtering asynchronously sampled data to directly apply a linear transfer function H(s) that describes the s-domain representation of an IIR filter or control plant to asynchronously sampled data $u_k$, $\Delta t_k$ is illustrated in FIG. 2. The first step (step 12), which is suitably performed off-line, is to map the coefficients of the linear transfer function H(s) given by:

$$H(s) = \frac{b_0 s^N \ldots + b_{N-1} s + b_N}{s^N \ldots + a_{N-1} s + d_N} \quad (1)$$

into a continuous state-space representation in which, $$\dot{X} = A \cdot X + B \cdot u \quad (2)$$
$$Y = C \cdot X + D \cdot u$$

where:

$$A = \begin{bmatrix} 0 & 1 & 0 & \cdots & 0 \\ 0 & 0 & 1 & \cdots & 0 \\ \vdots & \vdots & \vdots & \ddots & \\ 0 & \cdots & 0 & 0 & 1 \\ -a_N & \cdots & -a_3 & -a_2 & -a_1 \end{bmatrix}$$

$$B = \begin{bmatrix} 0 \\ \vdots \\ 0 \\ 1 \end{bmatrix}$$

$$C = [\, b_m - b_0 \cdot a_m \quad \cdots \quad (b_2 - b_0 \cdot a_2) \quad (b_1 - b_0 \cdot a_1)\,], \text{ and}$$
$$D = b_0.$$

and where:
u is the input,
X is the continuous state-space vector,
Y is the output,
A is the state transition matrix,
B is input gain matrix,
C is the output gain matrix, and
D is the input-to-output gain matrix, which is a scalar for a single input, a column vector single input/multiple output, a row vector multiple input/single output, and a matrix for multiple input/multiple output. D is often zero.

For the case of a single input channel in which a single input data sample is presented to the discrete state-space filter at a time, matrices B and C default to vectors and vector D defaults to a scalar value. If multiple input channels are present and sampled at the same asynchronous times they may be processed through the same discrete state-space filter.

The discrete state-space filter for asynchronously sampled data is defined by the following transformation:

$$X_k = \Phi \cdot X_{k-1} + \Gamma \cdot u_{k-1} \quad (3)$$
$$Y_k = C \cdot X_k + D \cdot u_{k-1} \quad (4)$$

where:

$$\Phi_k = e^{A \cdot \Delta t_k} \quad (5)$$
$$\Gamma_k = (e^{A \cdot \Delta t_k} - 1) \cdot A^{-1} \cdot B \quad (6)$$

and where:
$X_k$ is the discrete state-space vector that stores the filter states independent of sample-time,
Y is the output,
$\Phi_k$ is the discrete state transition matrix defining the extent the previous discrete state vector $X_{k-1}$ will affect the current state vector $X_k$, and
$\Gamma_k$ is the discrete input matrix defining the extent the previous state is expected to change due to input data sample $u_k$.

The filter memory elements are the states stored in $X_k$ and are independent of $\Delta t$. Matrices $\Phi_k$ and $\Gamma_k$ are updated for each asynchronous time measurement $\Delta t_k$ to propagate the asynchronous measurements in the filter states. The discrete state-space vector is initialized by, for example, setting all states to zero.

The core steps of the discrete state-space filter will be described first. Thereafter, optional steps and embodiments that improve computational efficiency and stability will be revisited.

The sample counter k is set to zero (step 14) and the discrete state-space filter receives an input sample $u_k$, $\Delta t_k$ (step 16). The discrete state transition matrix $\Phi_k$ and the discrete input matrix $\Gamma_k$ are updated from the continuous state-space representation (matrices A and B) and the time measurement $\Delta t_k$ of the input data sample (step 18). This "update" can be done in a number of ways including a direct calculation of $\Phi_k$ and $\Gamma_k$ as given in equations 5 and 6. The state vector $X_k$ is updated according to equation 3 (step 20) and the output $y_k$ is calculated according to equation 4 (step 22). The output amplitude $y_k$ occurs at the asynchronous sample time $t_k$ or $\Delta t_k$ with respect to the previous sample. The sample counter k is incremented (step 24) and the next sample is processed.

As given in equation 3, the transformation from a continuous state-space representation to the discrete state-space filter requires a matrix exponentiation to calculate $\Phi_k$. A direct computation of this matrix exponentiation is computationally burdensome and can cause stability problems, particularly as the filter order "m" gets larger. Round-off error and finite precision arithmetic causes numerical instability. This is particularly problematic for filters that operate with narrow rejection bands. There are a number of techniques for simplifying the calculation, precalculating and storing the discrete matrices and selectively skipping the update that can be implemented.

The direct calculation can be simplified by formulating the linear system H(s) as a cascade or parallel implementation of a plurality of $1^{st}$ and $2^{nd}$ order s-domain transfer functions $H^1(s)$, $H^2(s)$ . . . that are equivalent to the transfer function H(s). There are typically N/2 stages if N is rounded up to the nearest even integer. This decomposition is well-known using partial fraction expansion for linear systems. If each stage is stable than the cascade or parallel implementation is stable. Each of the transfer functions $H^1(s), H^2(s)\ldots$ are mapped into a continuous state-space representation and transformed into the discrete state-space filter as shown in FIG. 2. The parallel implementation is faster but requires more parallel processing capability. Another simplification, which can be done for the entire linear system H(s) or each of the stages $H^1(s)$, $H^2(s)\ldots$ of a cascade/parallel implementation, is to compute $\Phi_k$ using either a $1^{st}$ order approximation or a Jordan Canonical Form.

The $1^{st}$ order approximation is given by:

$$\Phi_k = I + A \cdot \Delta t_k \quad (7)$$

$$\Gamma_k = \begin{bmatrix} 0 \\ \vdots \\ \Delta t_k \end{bmatrix}$$

where I is the identity matrix. This $1^{st}$ order approximation works well when the linear system is decomposed into a cascade/parallel implementation of $1^{st}$ and $2^{nd}$ order functions.

The Jordan Canonical Form simplifies the matrix exponentiation to a scalar exponentiation and is given by:

$$J = V^{-1} \cdot A \cdot V \quad (8)$$

Where $$J = \begin{bmatrix} \lambda_1 & 0 & 0 \\ 0 & \ddots & 0 \\ 0 & 0 & \lambda_m \end{bmatrix} \quad (9)$$

And $\lambda$=eigenvalue of A., and $$\Phi' = \begin{bmatrix} e^{\lambda_1 \Delta t} & 0 & 0 \\ 0 & \ddots & 0 \\ 0 & 0 & e^{\lambda_m \cdot \Delta t} \end{bmatrix} \quad (10)$$

$$\Gamma' = (\Phi' - I) \cdot V \cdot B$$

$$C' = C \cdot V^{-1}$$

$$D' = D$$

The Jordan Canonical Form is a simplification of the matrix exponentiation but the output samples $y_k$ will have the same value. This approach would be preferred if a parallel/case implementation was not used. The Jordan Canonical Form is more efficient for the computation of higher order systems.

Another approach would be to precalculate and store $\Phi$ and $\Gamma$ for a number of values of $\Delta t$ (step 26). Instead of recalculating the matrices for each sample, the filter would select the closest matrices and use them directly or perform an interpolation. This would sacrifice some amount of accuracy in exchange for speed. In yet another approach, calculations of $\Phi$ and $\Gamma$ can be conserved by caching results (step 28) and monitoring $\Delta t$ (step 30). If the value changes by more than a specified tolerance, $\Phi$ and $\Gamma$ are recalculated (step 18). Otherwise the last updated matrices or default matrices (e.g. for an expected uniform sampling period) are read out of the cache (step 28) and used to update the state vector. The latter approach is particularly efficient for systems that are designed to be sampled at uniform intervals but for some reason experience "drop out". A large percentage of the samples can be processed with the cached or "default" matrices. When a drop out is detected resulting in a $\Delta t$ different from that in cache, the matrices are updated.

A hardware implementation of a single input, single output discrete state-space filter 50 that uses a 1st order approximation of the matrix exponential for a parallel form of 2nd order subsystems is illustrated in FIGS. 3-6. Filter 50 includes two primary components; a coefficient arithmetic unit (CAU) 52 that updates $\Phi_k$ and $\Gamma_k$ and a filter core 54 that updates the state vector $X_k$ and calculates the output $y_k$.

The continuous state-space representation matrices A, C and D are provided from a coefficient bus 56 to a bus decoder 58. In this implementation, matrix B is [0, 0, . . . 1] and is hardcoded into the CAU. Matrices A, C and D are expressed in the appropriate parallel form in which sub-matrix A is 2×2, C is 2×1 and D is a scalar. There are N/2 sets of sub-matrices where the index M=N−1. Bus decoder 58 decodes the incoming data and writes the sub-matrices into the appropriate locations in a static coefficient memory 60. The continuous state-transition sub-matrix A is directed to the CAU 52 and the output gain and input-to-output sub-matrices C and D are directed to the fitter core 54.

Figure 5:
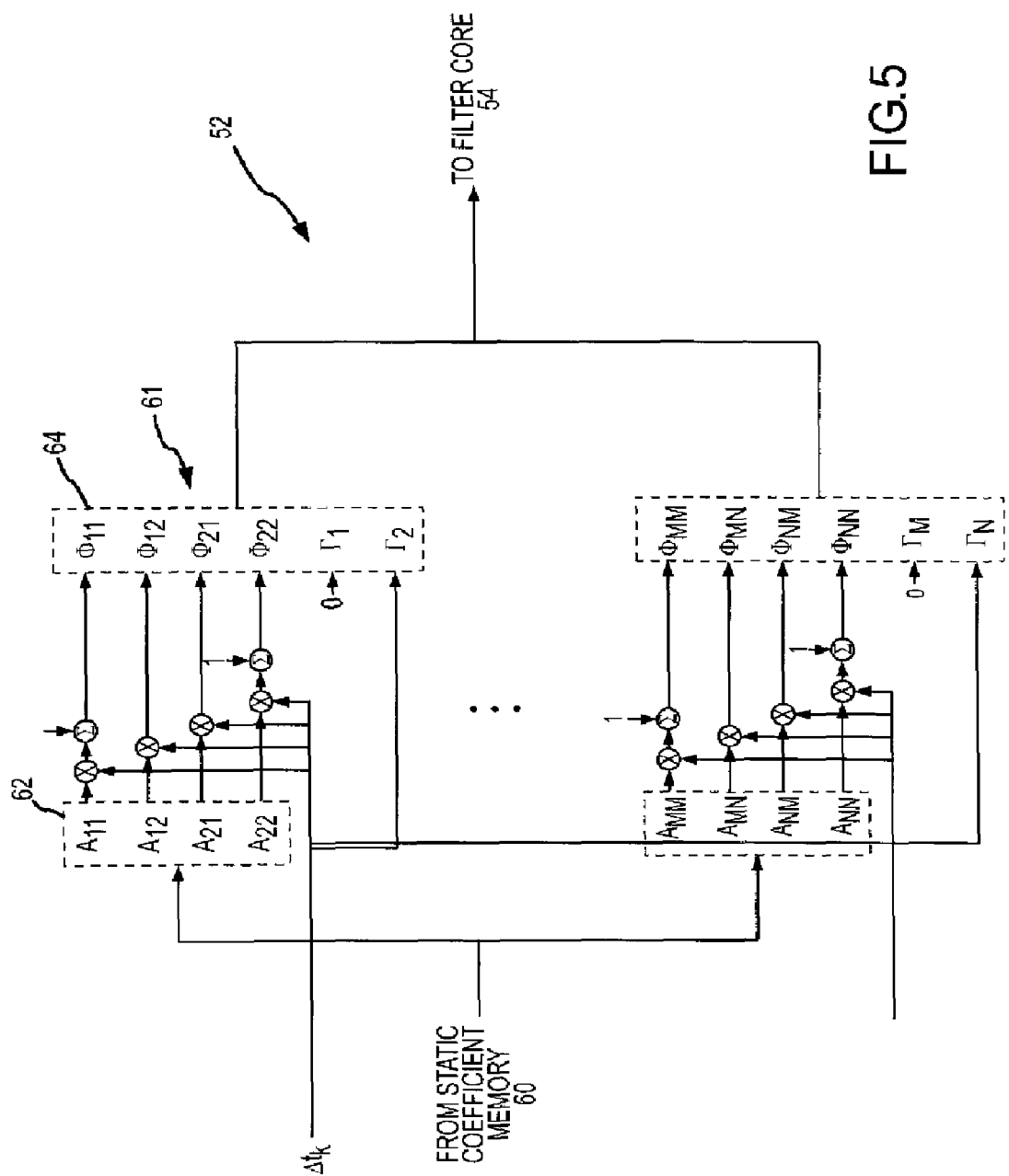
FIG. 5 is a block diagram of the filter's coefficient arithmetic unit for a parallel implementation and $1^{st}$ order approximation.

For each input data sample, CAU receives time measure $\Delta t_k$ and updates $\Phi_k$ and $\Gamma_k$. As shown in FIG. 5, each of the N/2 stages 61 calculates a $1^{st}$ order approximation of the matrix exponential as given by equation 7 above. Higher order approximations can be implemented at the cost of increased processing capability. More specifically, $\Delta t_k$ is multiplied by each of the four static A sub-matrix coefficients 62 (e.g. $A_{11}$, $A_{12}$, $A_{21}$ and $A_{22}$) and a scalar value 1 is added to the diagonal terms $A_{11}$ and $A_{22}$ to give the four dynamic $\Phi_k$ sub-matrix coefficients 64. $\Gamma_1$=0 and $\Gamma_2$=$\Delta t_k$. The updates $\Phi_k$ and $\Gamma_k$ sub-matrices are directed to the filter core 54.

As described above, a cache controller 66 may be included to monitor $\Delta t_k$ and decide whether a recalculation of $\Phi_k$ and $\Gamma_k$ is warranted or whether the previously updated sub-matrices $\Phi_{k-1}$ and $\Gamma_{k-1}$ or default sub-matrices, which were stored in a coefficient cache 68, are acceptable. In a system that is ordinarily synchronous but subject to drop-out this approach can conserve considerable processing resources. Although not shown in this embodiment, $\Phi$ and $\Gamma$ sub-matrices for $\Delta t$ could be read in from a bus and stored in memory. The controller or CAU (if reconfigured) could access the memory to select the appropriate sub-matrices for each $\Delta t_k$.

Figure 6:
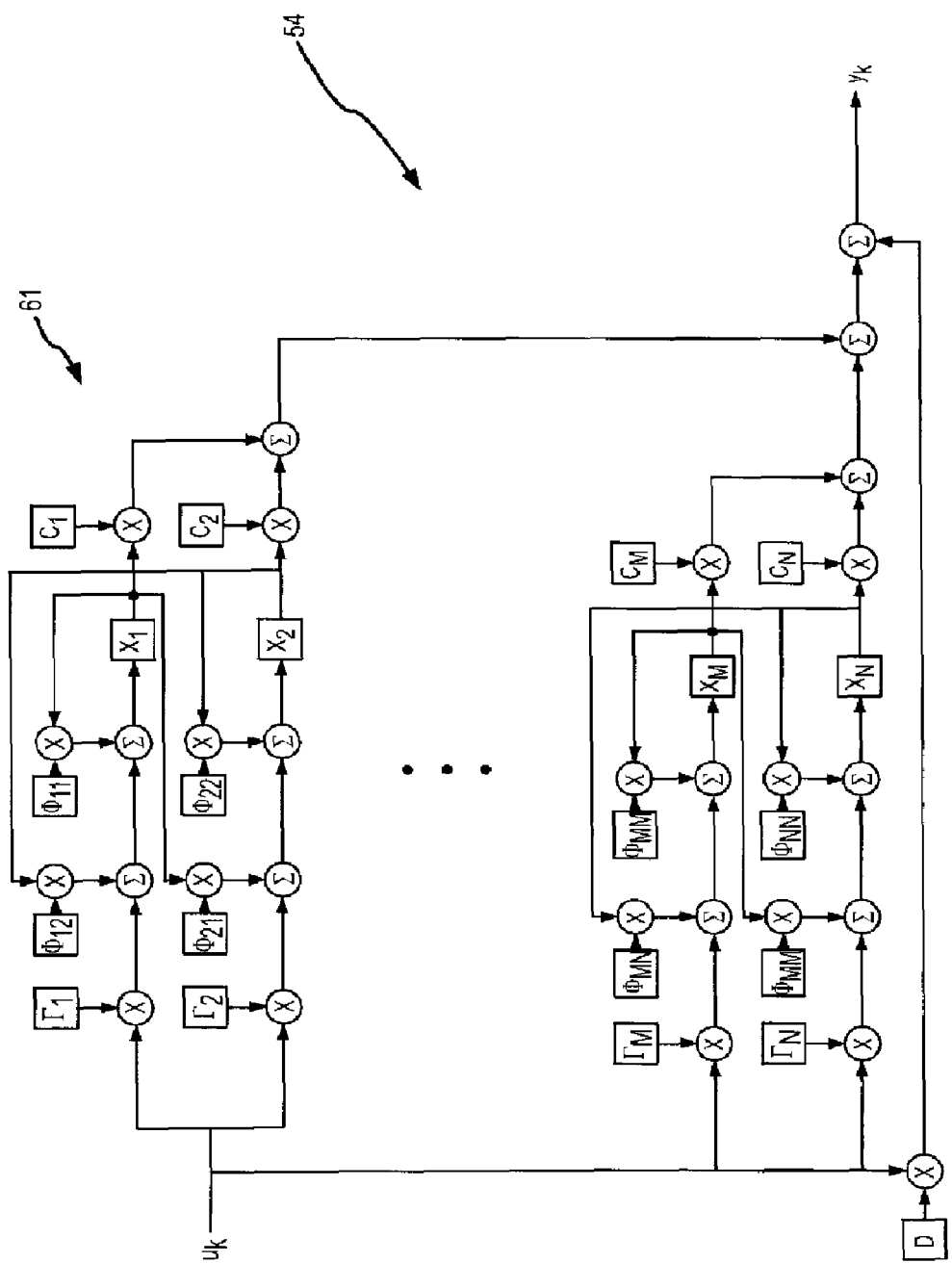
FIG. 6 is a block diagram of the filter's filter core for the parallel implementation.

Filter core 54 receives the continuous sub-matrices C and D, the updated $\Phi_k$ and $\Gamma_k$ submatrices and the amplitude $u_k$ of the current sample, updates the state vector $X_k$ as given by equation 3 and calculates the output $y_k$ as given by equation 4. More specifically as shown in FIG. 6, to update the state vector $X_k$=[$X_1,X_2$] for the first stage 61 the sample amplitude $u_k$ is multiplied by $\Gamma_k$=[$\Gamma_1,\Gamma_2$] and summed with the product of $\Phi_k$=[$\Phi_{11}, \Phi_{12}, \Phi_{21}, \Phi_{22}$] and the previous state-vector $X_{k-1}$=[$X_1,X_2$]. The updated state vector $X_k$=[$X_1,X_2$] is multiplied by output gain sub-matrix C=[$C_1,C_2$] and summed to provide a scalar value for $C*X_k$. In this implementation the scalar values for each stage are summed together and than added to the produce of the input-to-output gain D multiplied by sample amplitude $u_k$ to provide the filtered output sample $y_k$. In many instances D is zero.

Figure 7A:
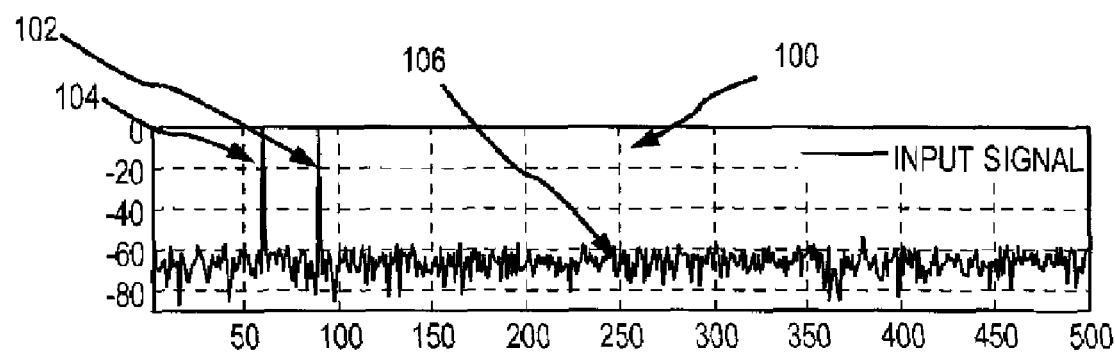
FIGS. 7-10 are plots illustrating the performance of the asynchronous state-space filter for an IIR filter design.
Figure 7B:
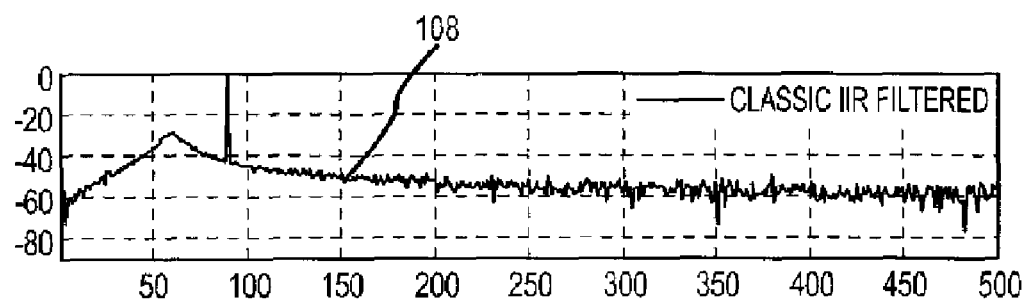
Figure 7C:
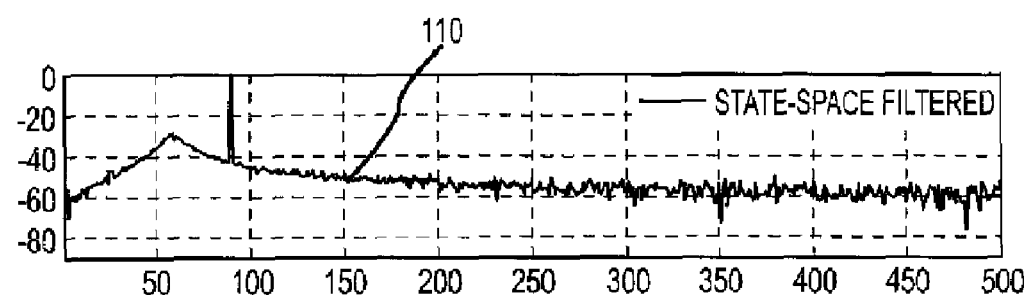

The performance of the discrete state-space filter has been simulated for both IIR notch filters and a linear control plant as part of a servo compensator and the results compared to classic IIR filters and control plants for both uniformly and asynchronously sampled data. As will be shown, the discrete filter's performance is the same or even better than the classic techniques for uniformly sampled data and far superior for asynchronously sampled data. The discrete filter does not suffer from the frequency domain warping inherent in classic mapping techniques such as the zero-order hold or bilinear transform. Furthermore, the discrete filter is superior to oversampling because it does not inject interpolation or extrapolation error. The discrete filter inherently and automatically adapts to the type and extent of asynchronism in the sampled data and thus enables the use of less expensive, lower power A/D converters and the use of low-cost computers and operating systems for real-time control computing problems. The cost of this improved performance is approximately 6× computational complexity of an equivalent order IIR filter The performance of the discrete state-space filter and a classic IIR filter for a variety of test conditions are illustrated in FIGS. 7-10. The modeled filter is a 2-pole notch with 30 dB of rejection at 60 hz. The input signal 100 includes a 0 dB signal 102 at 90 hz with interference of 0 dB at 60 hz 104 +/−40 dB Gaussian noise 106 as shown in FIG. 7a. In the first test, the performance of the classic IIR notch filter and discrete filter were evaluated assuming ideal uniform sampling of $\Delta t=1$ ms. As shown in FIGS. 7b and 7c, the filtered spectra 108 and 110 for the classic IIR notch filter and the discrete filter, respectively, and virtually identical. Both filters pass the desired signal 102 and provide about −30 dB rejection of the 60 hz interference 104. Note however that this test allowed the classic IIR filtered to be designed for ideal uniformly sampled data. If the IIR filter was designed to tolerate some amount of jitter there would be noticeable performance degradation even if the actual sampled data were perfectly uniform. The designed in tolerance creates some performance degradation of the filter and cannot adapt to changing sampling conditions. Likewise the discrete filter is based on the existing transfer function for the IIR filter assuming ideal uniformly sampled data but adapts to the changing sampling conditions.

Figure 8A:
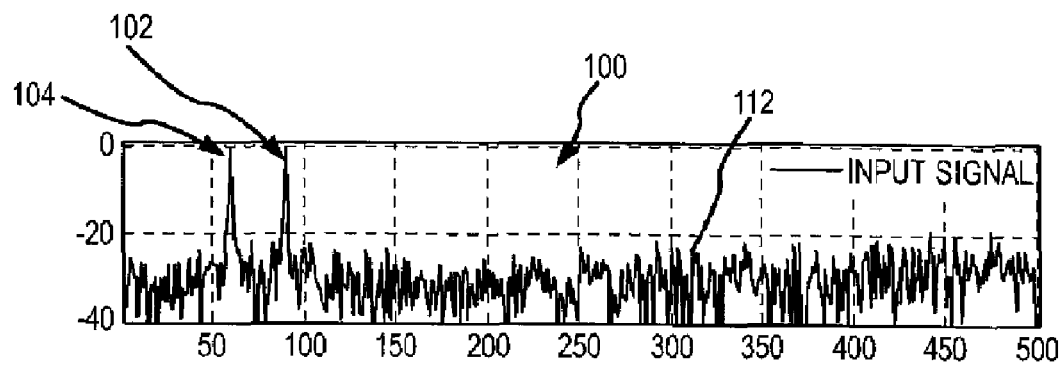
Figure 8B:
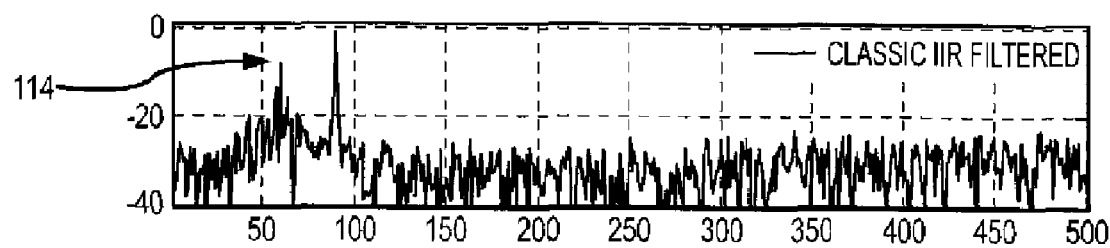
Figure 8C:
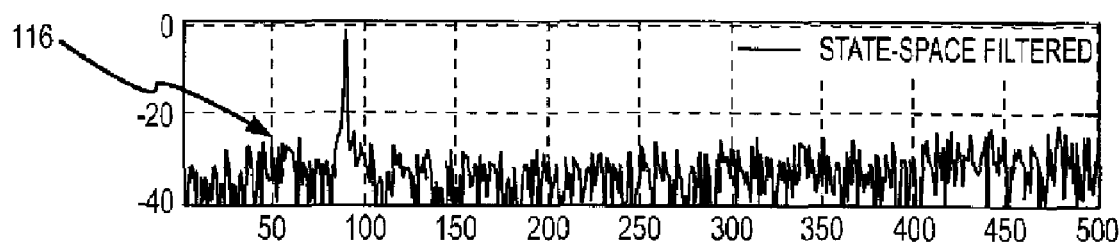

In a second test, the input signal 100 was asynchronously sampled at $\Delta t=1$ ms+/−0.5 ms of jitter with a uniform distribution. The increase in the noise floor 112 of the input signal shown in FIG. 8a is a result of an artifact of non-uniform sampling and the FFT used for analysis. As shown in FIG. 8b, the filtered spectra 114 of the classic IIR rejects only 12 dB of the interference 104. By comparison, the filtered spectra 116 of the discrete state-space filter rejects 26 dB of the interference 104. The discrete filter adapts to the changing sampling conditions at each sample, hence is able to approximately maintain the designed performance levels.

Figure 9A:
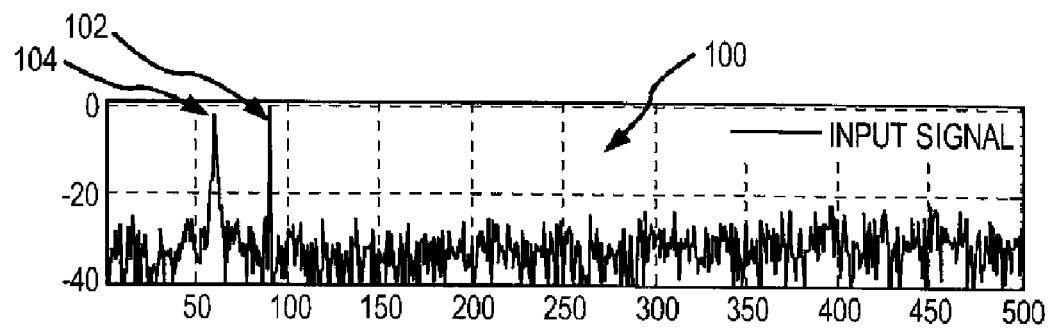
Figure 9B:
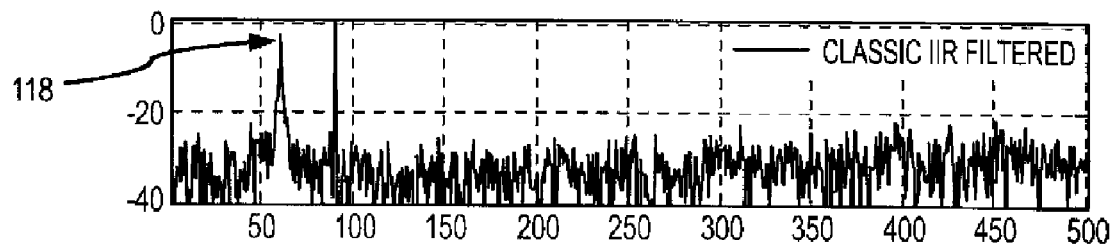
Figure 9C:
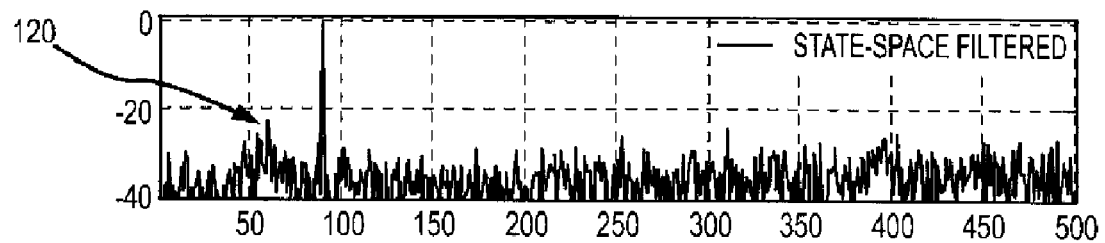

In a third test, the input signal 100 shown in FIG. 9a was uniformly sampled at $\Delta t=1$ ms but with a 25% drop-out rate creating asynchronous data. As shown in FIG. 8b, the filtered spectra 118 of the classic IIR rejects only 3 dB of the interference 104. By comparison, the filtered spectra 120 of the discrete state-space filter rejects 23 dB of the interference 104. The discrete filter adapts to the changing sampling conditions caused by the drop-out, hence is able to largely maintain the designed performance levels.

Figure 10A:
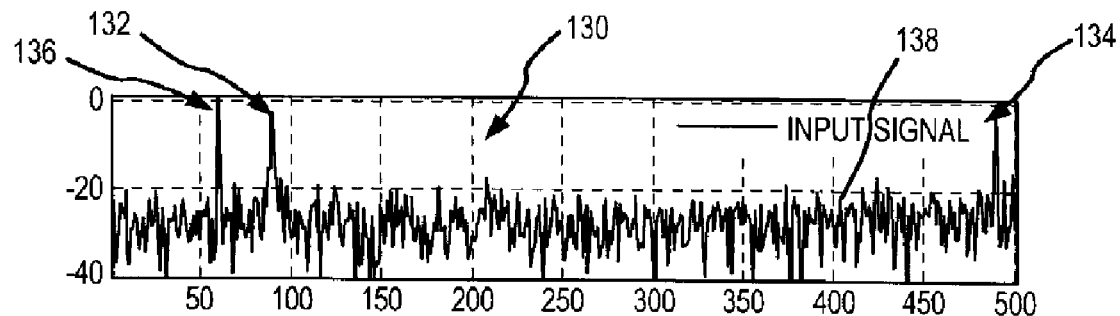
Figure 10B:
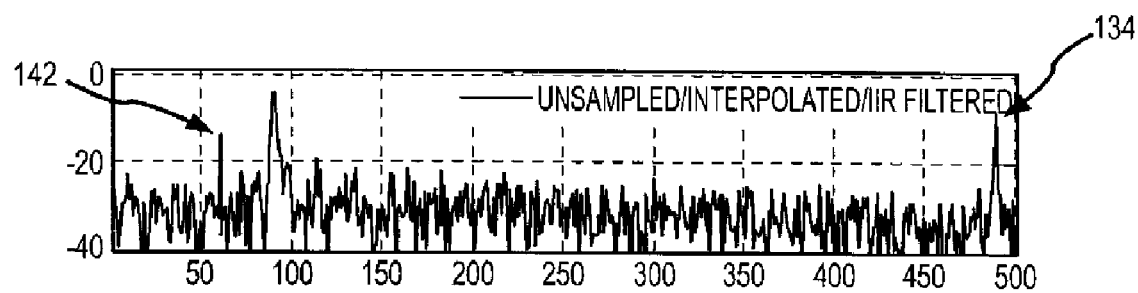
Figure 10C:
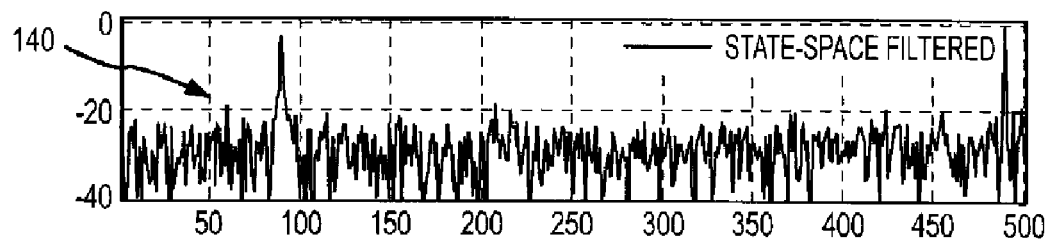

In a fourth test, the modeled filter is the same 2-pole notch with 30 dB of rejection at 60 hz. The input signal 130 includes a 0 dB signal 132 at 90 hz and a 0 dB signal 134 at 490 hz with interference of 0 dB at 60 hz 136 +/−40 dB Gaussian noise 138 as shown in FIG. 10a. For the discrete filter, the signal is asynchronously sampled at $\Delta t=1$ ms+/−0.5 ms of jitter with a Gaussian distribution. As shown in FIG. 10c, the filtered spectra 140 provides approximately 20 dB of rejection at 60 hz and passes the signal at 90 hz and 490 largely unaffected.

For the classic IIR filter, the signal is resampled by 4× at $\Delta t=0.25$ ms and than interpolated to create uniformly sampled data. As shown in FIG. 10b, the filtered spectra 142 provides about 15 dB of rejection at 60 hz, passes the signal at 90 hz but attenuates the higher frequencies including the signal 134 at 490 hz.

Figure 11:
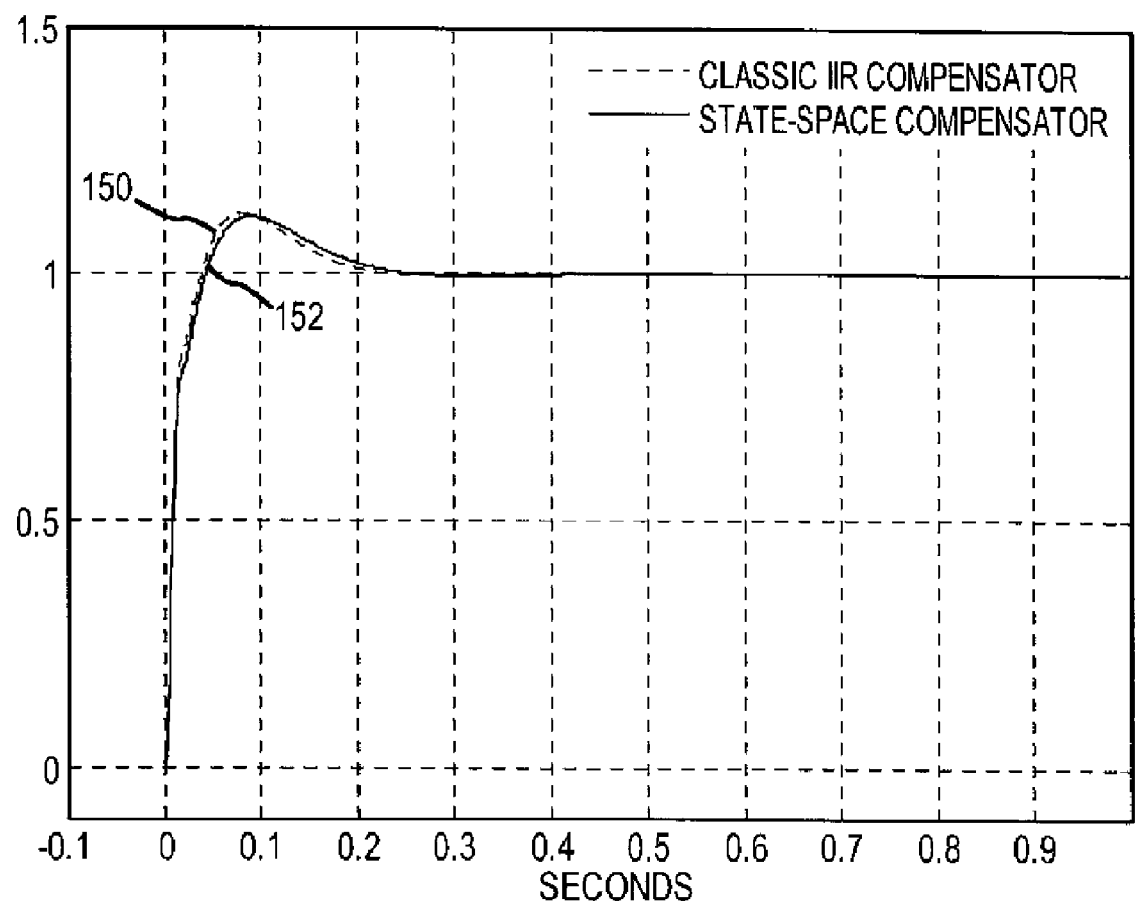
FIGS. 11-13 are plots illustrating the performance of the asynchronous state-space filter for a linear control plant design.
Figure 12:
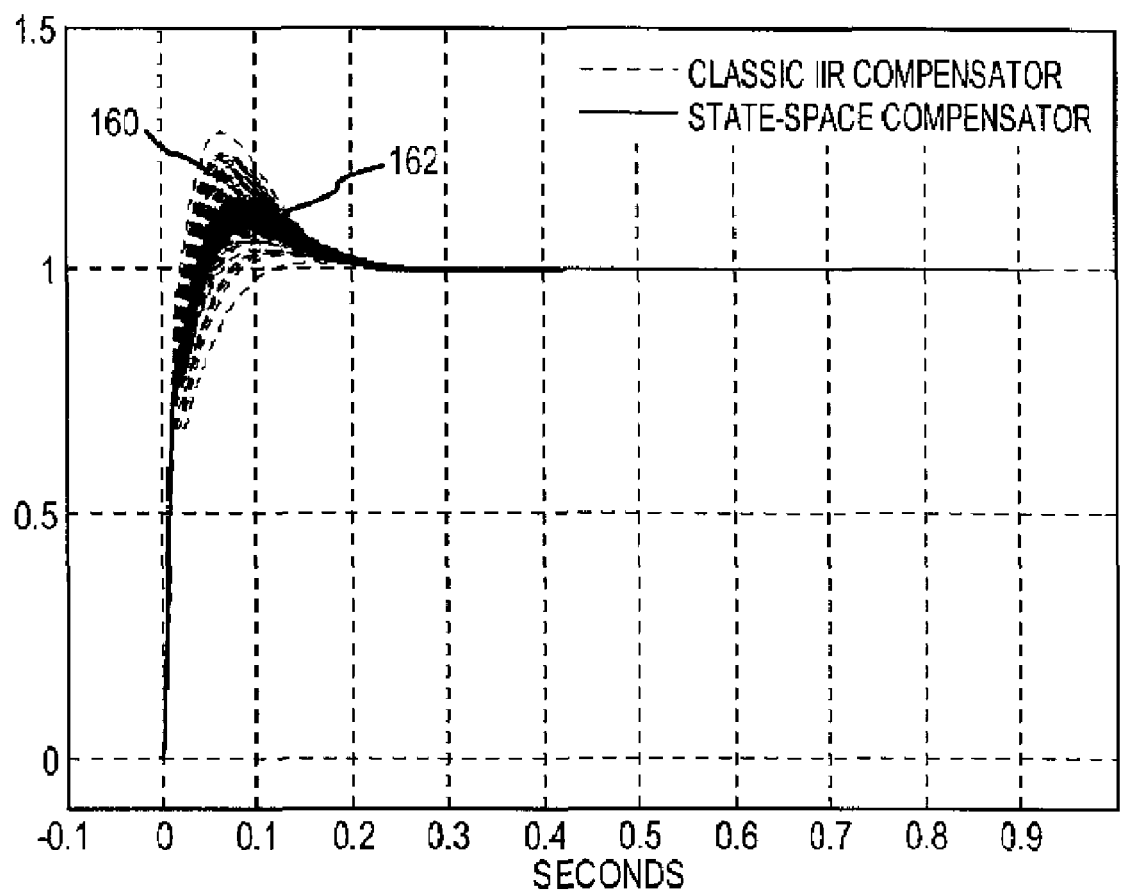
Figure 13:
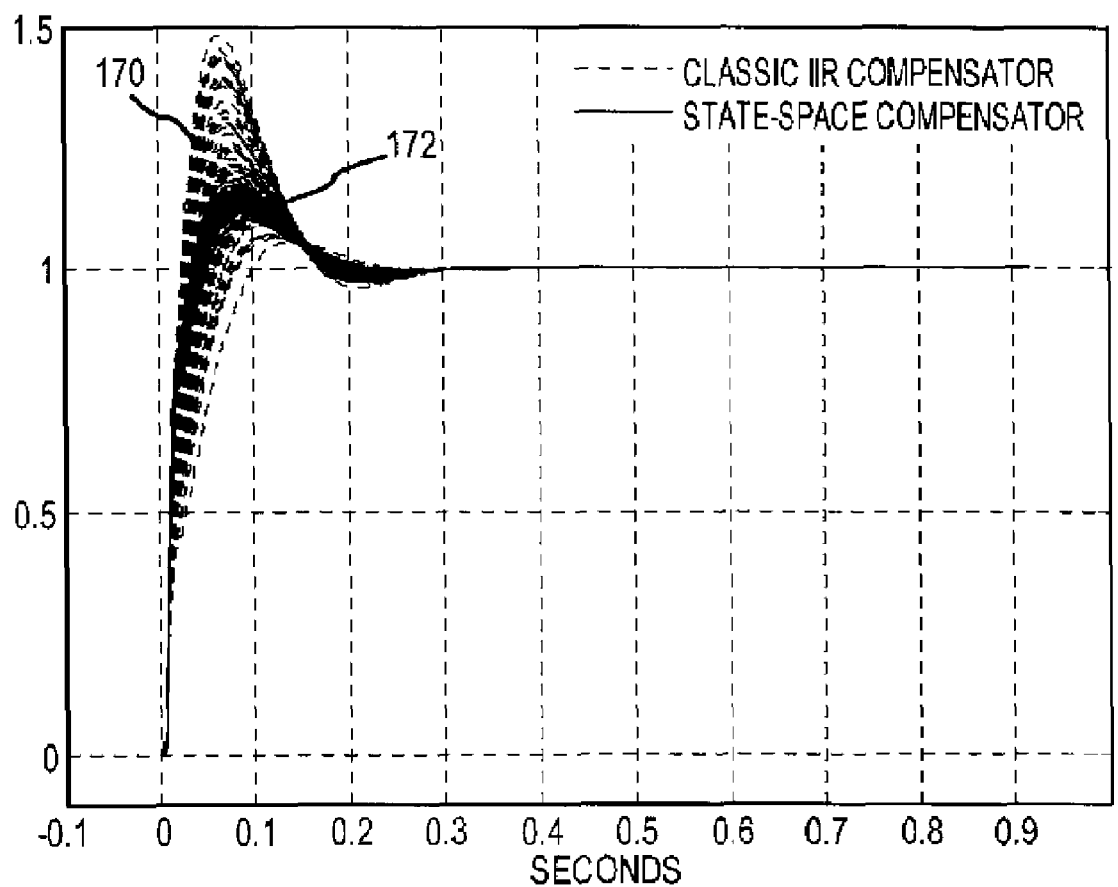

The performance of the discrete state-space filter and a classic IIR compensator for a linear control plant under a variety of test conditions are illustrated in FIGS. 11-13. The modeled linear control plant is a double integrator servo.

In the first test, the performance of the classic IIR compensator and the discrete state-space compensator were evaluated assuming ideal uniform sampling of $\Delta t=1$ ms. As shown in FIG. 11, the impulse responses 150 and 152 of the IIR compensator and state-space compensator, respectively, are virtually identical. However, as in the notch filter application, if the classic IIR compensator were designed to tolerate some specified amount of jitter by modifying its transfer function the performance would be degraded even if the actual sampling were ideally uniform. Conversely, the state-space compensator can be designed from the ideal transfer function, no built in tolerance is required.

In a second test, the input signal was asynchronously sampled at $\Delta t=1$ ms+/−0.5 ms of jitter with a uniform distribution. As shown in FIG. 11, the step responses 160 and 162 of the IIR compensator and state-space compensator, respectively, were plotted for one-hundred runs of a Monte Carlo simulation. The simulation revealed a wide variation in the transient response of the classic IIR compensator and minimal variation in the state-space compensator.

In a third test, the input signal was uniformly sampled at $\Delta t=1$ ms but with a 50% drop-out rate creating asynchronous data. As shown in FIG. 12, the impulse responses 170 and 172 of the IIR compensator and state-space compensator, respectively, were plotted for one-hundred runs of a Monte Carlo simulation. The simulation again revealed a wide variation in the transient response of the classic IIR compensator and minimal variation in the state-space compensator.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method of discrete time filtering asynchronously sampled data, comprising:
   a) mapping the coefficients of a linear frequency-domain transfer function H(s) into a continuous-time state-space representation;
   b) initializing a discrete state vector $X_k$ that stores filter states independent of sample-time;
   c) sampling by an A/D converter an analog signal to produce a sequence of asynchronous data samples, each said sample having an amplitude $u_k$ and time measurement $\Delta t_k$;
   d) updating a discrete state transition matrix $\Phi_k$ and a discrete input matrix $\Gamma_k$ from the continuous state-space representation and the time measurement $\Delta t_k$ of the input data sample, said discrete state transition matrix $\Phi_k$ defining the extent the previous discrete state vector will affect the current state vector and said discrete input matrix $\Gamma_k$ defining the extent the previous filter state is expected to change due to input data sample;
   e) updating the discrete state vector $X_k$ by propagating the filter states in the previous state vector $X_{k-1}$ with the time measurements within the discrete state transition matrix $\Phi_k$ and summing with the sample amplitude $u_k$ weighted by the discrete input matrix $\Gamma_k$;

f) calculating at least at least one output data sample amplitude $y_k$ from the updated discrete state vector $X_k$, the sample amplitude $u_k$ and continuous-time state-space representation; and g) repeating steps d through f for the next asynchronous data sample.

2. The method of claim 1, wherein the linear frequency-domain transfer function is an infinite impulse response (IIR) filter.

3. The method of claim 2, wherein the IIR filter transfer function is the transfer function for an existing design assuming ideal uniform sampling.

4. The method of claim 1, wherein the linear frequency-domain transfer function is a linear control plant.

5. The method of claim 4, wherein the control plant transfer function is the transfer function for an existing design assuming ideal uniform sampling.

6. The method of claim 1, wherein $\Phi_k$ and $\Gamma_k$ are updated according to calculations $\Phi_k = e^{A*\Delta tk}$ and $\Gamma_k = (\Phi_k - I)*A^{-1}*B$ where I is the identity matrix, A is the continuous state transition matrix and B is the input gain matrix from the continuous-time state-space representation.

7. The method of claim 6, wherein $\Phi_k$ and $\Gamma_k$ are updated using a first order approximation of the matrix exponential $e^{A*\Delta tk}$.

8. The method of claim 6, wherein $\Phi_k$ and $\Gamma_k$ are updated using a Jordan Canonical Form to simplify the matrix exponential $e^{A*\Delta tk}$.

9. The method of claim 1, wherein $X_k = \Phi_k * X_{k-1} + \Gamma_k * u_k$.

10. The method of claim 1, wherein $y_k = C*X_k + D*u_k$ where C is the output gain matrix and D is the input-to-output gain matrix from the continuous-time state-space representation.

11. The method of claim 1, further comprising:
using partial fraction expansion to decompose the linear frequency-domain transfer function H(s) into a plurality of transfer functions; and
performing steps (a)-(g) for each said transfer function in parallel or in cascade.

12. The method of claim 1, further comprising pre-calculating and storing $\Phi$ and $\Gamma$ for a plurality of $\Delta t$ values, wherein $\Phi_k$ and $\Gamma_k$ are updated by reading out $\Phi$ and $\Gamma$ in accordance with the value of $\Delta t_k$.

13. The method of claim 12, further comprising interpolating $\Phi_m$ and $\Gamma_m$ at $\Delta t_m$ and $\Phi_n$ and $\Gamma_n$ at $\Delta t_m$ where $\Delta t_m < \Delta t_k < \Delta t_n$ to update $\Phi_k$ and $\Gamma_k$.

14. The method of claim 1, further comprising:
monitoring $\Delta t_k$ received in step (c);
if $\Delta t$ changes by more than a specified tolerance, updating $\Phi_k$ and $\Gamma_k$ in step (d); and
otherwise skipping step (d) and using the last updated matrices $\Phi_{k-1}$ and $\Gamma_{k-1}$ or default matrices $\Phi_U$ and $\Gamma_U$ for an expected uniform sampling period to update the state vector $X_k$ in step (e).

15. The method of claim 14, wherein the data samples are ordinarily uniformly sampled but subject to drop out that causes $\Delta t_k$ to be asynchronous, said default matrices $\Phi_U$ and $\Gamma_U$ being used to update the state vector for the uniformly sampled data samples.

16. A method of processing asynchronously sampled data, comprising:

a) mapping the coefficients of a linear frequency-domain transfer function H(s) that describes the s-domain representation of an infinite impulse response (IIR) filter or a linear control plant into a continuous-time state-space representation including a state transition matrix A, an input gain matrix B, an output gain matrix C and a input-to-output gain matrix D;

b) receiving an amplitude $u_k$ and time measurement $\Delta t_k$ of a $k^{th}$ data sample;

c) updating a discrete state transition matrix $\Phi_k = e^{A*\Delta tk}$ using a first order approximation of the matrix exponential $e^{A*\Delta tk}$ and a discrete input matrix $\Gamma_k = (\Phi_k - I)*A^{-1}*B$ where I is the identity matrix;

d) updating a discrete state vector $X_k = \Phi_k * X_{k-1} + \Gamma_k * u_k$;

e) calculating an output amplitude $y_k = C*X_k + D*u_k$; and f) repeating steps b through e for the next k+1 asynchronous data sample.

17. The method of claim 16, wherein the linear frequency-domain transfer function is the s-domain representation of an IIR filter for an existing design assuming ideal uniform sampling.

18. The method of claim 16, wherein the linear frequency-domain transfer function is the s-domain representation of a linear control plant for an existing design assuming ideal uniform sampling.

19. A method of using a discrete state-space representation of a linear transfer function including a discrete state transition matrix $\Phi$ and a discrete input matrix $\Gamma$ to update a discrete state vector $X_k$ and calculate a output sample $y_k$ where $\Phi_k$ defines the extent the previous discrete state vector will affect the current state vector and $\Gamma_k$ defines the extent the previous filter state is expected to change due to input data sample, comprising for each $k^{th}$ input data sample $u_k$ having a time measurement $\Delta t_k$:

updating by a coefficient arithmetic unit (CAU) the discrete state transition matrix $\Phi_k = e^{A*\Delta tk}$ using a first order approximation of the matrix exponential $e^{A*\Delta tk}$ where A is a state transition matrix of the continuous-time state-space representation of the linear transfer function;

updating by the CAU the discrete input matrix $\Gamma_k = (\Phi_k - I)*A^{-1}*B$ where I is the identity matrix and B is the input gain matrix of the continuous-time state-space representation of the linear transfer function; and updating by a filter core the discrete state vector $X_k = \Phi_k * X_{k-1} + \Gamma_k * u_k$.

20. A discrete time filter for processing asynchronously sampled data, comprising:

a coefficient arithmetic unit (CAU) configured to receive a portion of a continuous-time state-space representation of a linear frequency-domain transfer function H(s) and a time measurement $\Delta t_k$ of each successive data sample and to update a discrete state transition matrix $\Phi_k$ and a discrete input matrix $\Gamma_k$ from the continuous state-space representation and the time measurement of the data sample, said discrete state transition matrix defining the extent the previous discrete state vector $X_{k-1}$ will affect the current state vector $X_k$ and said discrete input matrix defining the extent the previous state is expected to change due to input data sample; and a filter core that stores filter states sample-time independently in a discrete state vector $X_k$, said core configured to receive the updated discrete state transition matrix $\Phi_k$ and the discrete input matrix $\Gamma_k$ from the CAU, an amplitude $u_k$ of the data sample and another portion of the continuous-time state-space representation, to update the discrete state vector $X_k$ by propagating the filter states in the previous state vector $X_{k-1}$ with the time measurements within the discrete state transition matrix $\Phi_k$ and summing with the sample amplitude $u_k$ weighted by the discrete input matrix $\Gamma_k$, and to calculate an output data sample amplitude $y_k$ as a function of the updated discrete state vector $X_k$, the sample amplitude $u_k$ and the another portion of the continuous-time state-space representation.

21. The discrete time filter of claim 20, further comprising: a coefficient memory configured to receive and store the continuous-time state-space representation including a state transition matrix A and an input gain matrix B that are directed to the CAU and an output gain matrix C and a input-to-output gain matrix D that are directed to the filter core.

22. The discrete time filter of claim 21, wherein the CAU updates $\Phi_k = e^{A*\Delta tk}$ and $\Gamma_k = (\Phi_k - I)*A^{-1}*B$ where I is the identity matrix and the filter core updates $X_k = \Phi_k * X_{k-1} + \Gamma_k * u_k$ and calculates $y_k = C*X_k + D*u_k$.

23. The discrete time filter of claim 22, wherein the CAU updates $\Phi_k$ using a first order approximation of the matrix exponential $e^{A*\Delta tk}$.

24. The discrete time filter of claim 20, wherein $\Phi$ and $\Gamma$ for a plurality of $\Delta t$ values are pre-calculated and stored in a coefficient cache, said CAU updating $\Phi_k$ and $\Gamma_k$ by reading out $\Phi$ and $\Gamma$ in accordance with the value of $\Delta t_k$.

25. The discrete time filter of claim 20, wherein last updated matrices $\Phi_{k-1}$ and $\Gamma_{k-1}$ or default matrices $\Phi_U$ and $\Gamma_U$ for an expected uniform sampling period are stored in a coefficient cache the further comprising a cache controller that monitors $\Delta t_k$, if $\Delta t_k$ changes by more than a specified tolerance, the cache controller directs the CAU to update $\Phi_k$ and $\Gamma_k$ and otherwise directs the CAU to forward the last updated matrices $\Phi_{k-1}$ and $\Gamma_{k-1}$ or default matrices $\Phi_U$ and $\Gamma_U$ from the coefficient cache to the filter core to update the state vector $X_k$.

* * * * *